(12) United States Patent
Kubo et al.

(10) Patent No.: US 10,717,135 B2
(45) Date of Patent: Jul. 21, 2020

(54) COATED TOOL

(71) Applicant: KYOCERA CORPORATION, Kyoto-shi, Kyoto (JP)

(72) Inventors: Hayato Kubo, Satsumasendai (JP); Yoshikazu Kodama, Satsumasendai (JP); Hirotoshi Itoh, Satsumasendai (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 110 days.

(21) Appl. No.: 16/079,581

(22) PCT Filed: Feb. 24, 2017

(86) PCT No.: PCT/JP2017/007048
§ 371 (c)(1),
(2) Date: Aug. 24, 2018

(87) PCT Pub. No.: WO2017/146200
PCT Pub. Date: Aug. 31, 2017

(65) Prior Publication Data
US 2019/0039148 A1 Feb. 7, 2019

(30) Foreign Application Priority Data

Feb. 24, 2016 (JP) .................................. 2016-033287
Feb. 24, 2016 (JP) .................................. 2016-033288

(51) Int. Cl.
*B23B 27/14* (2006.01)
*B23B 27/16* (2006.01)
*C23C 16/36* (2006.01)

(52) U.S. Cl.
CPC .............. *B23B 27/16* (2013.01); *B23B 27/14* (2013.01); *C23C 16/36* (2013.01); *B23B 2228/10* (2013.01)

(58) Field of Classification Search
USPC ........... 51/307, 309; 407/119; 428/216, 336, 428/698, 701, 702
See application file for complete search history.

(56) References Cited

U.S. PATENT DOCUMENTS

2014/0017469 A1   1/2014   Fukunaga et al.

FOREIGN PATENT DOCUMENTS

| JP | 2000071108 A | | 3/2000 |
| JP | 2010-172989 | * | 8/2010 |
| JP | 2012071396 A | | 4/2012 |
| WO | 2012133461 A1 | | 10/2012 |

* cited by examiner

*Primary Examiner* — Archene A Turner
(74) *Attorney, Agent, or Firm* — Viering, Jentschura & Partner MBB

(57) ABSTRACT

A coated tool may include a substrate and a coating layer located on a surface of the substrate. The coating layer includes: a first titanium carbonitride layer located on the substrate; a second titanium carbonitride layer located on the first titanium carbonitride layer; and an aluminum oxide layer located on the second titanium carbonitride layer. The first titanium carbonitride layer includes a plurality of first protrusions protruding toward a side of the aluminum oxide layer. The second titanium carbonitride layer includes a plurality of second protrusions protruding toward a side of the aluminum oxide layer. A number of second protrusions is greater than that of the first protrusions.

16 Claims, 3 Drawing Sheets

COATED TOOL

CROSS-REFERENCE TO RELATED APPLICATIONS

This application is a national stage entry according to 35 U.S.C. 371 of PCT Application No. PCT/JP2017/007048 filed on Feb. 24, 2017, which claims priority to Japanese Application No. 2016-033287 filed on Feb. 24, 2016, and Japanese Application No. 2016-033288 filed on Feb. 24, 2016, which are entirely incorporated herein by reference.

TECHNICAL FIELD

The present disclosure relates to a coated tool including a coating layer on a surface of a substrate.

BACKGROUND

A coated tool including a coating layer formed by laminating a titanium carbonitride layer and an aluminum oxide layer on the surface of a substrate such as cemented carbide, cermet and ceramics is known.

In recent years, the efficiency of the cutting process has been increased, and there is an increasing opportunity to use the above-mentioned coated tool for cutting work on which the large impact is applied to the cutting edge, including heavy interrupted cutting. Under such severe cutting conditions, since a large impact is applied to the coating layer, chipping and peeling of the coating layer are likely to occur. Therefore, improvement of fracture resistance is required for the coating layer in addition to wear resistance.

As a technology for improving fracture resistance in a coated tool, a technique described in JP-A-2000-071108 (Patent Document 1) is known. Patent Document 1 discloses that a titanium carbonitride layer and an aluminum oxide layer are formed and there is a region where fine pores are distributed in a specific region in the titanium carbonitride layer.

In the present circumstances, further improvement of wear resistance and fracture resistance of the coating layer is required.

SUMMARY

In one non-limiting aspect, a coated tool of the invention includes a substrate and a coating layer located on a surface of the substrate. The coating layer includes: a first titanium carbonitride layer located on the substrate; a second titanium carbonitride layer located on the first titanium carbonitride layer; and an aluminum oxide layer located on the second titanium carbonitride layer. The first titanium carbonitride layer includes a plurality of first protrusions protruding toward a side of the aluminum oxide layer. The second titanium carbonitride layer includes a plurality of second protrusions protruding toward a side of the aluminum oxide layer. A number of the second protrusions is greater than a number of the first protrusions.

DETAILED DESCRIPTION

Figure 2:
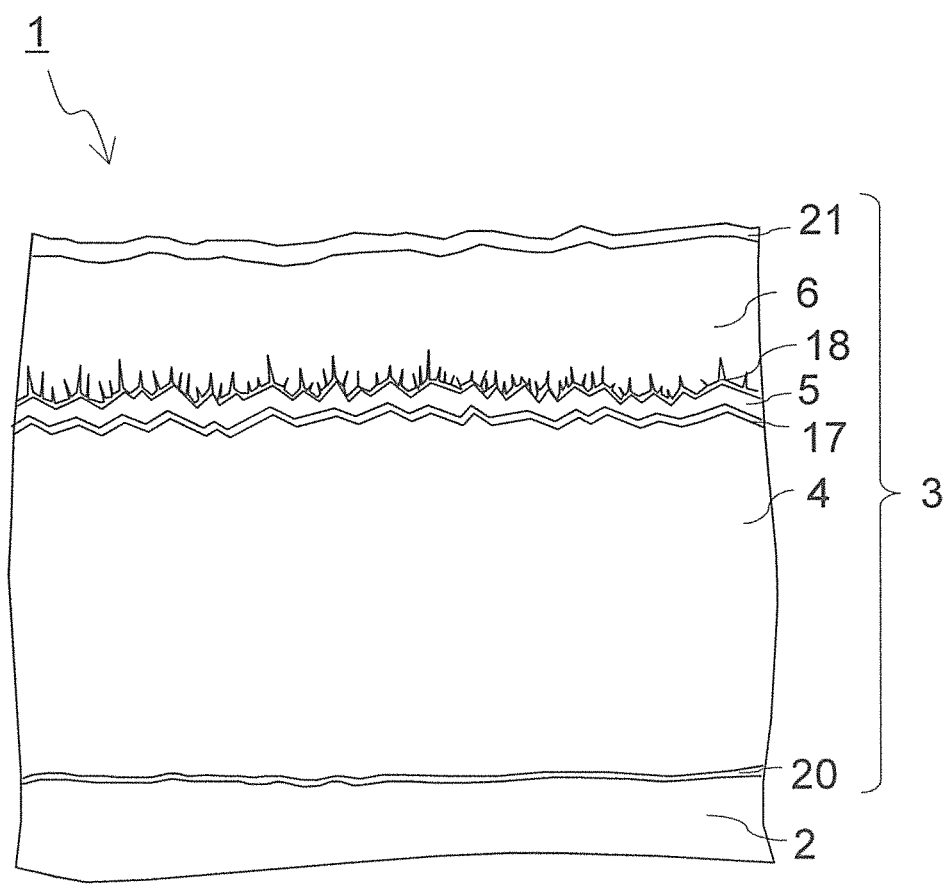
FIG. 2 is a schematic cross-sectional view of the coated tool shown in FIG. 1.

As a coated tool according to a non-limiting embodiment, a cutting tool (hereinafter simply referred to as a tool) 1 will be described with reference to the drawings. As shown in FIG. 2, the tool 1 includes a substrate 2 and a coating layer 3 located on a surface of the substrate 2.

The coating layer 3 is composed of: a first titanium carbonitride layer 4 containing titanium carbonitride (TiCN) (hereinafter simply referred to as a first layer 4); a second titanium carbonitride layer 5 containing titanium carbonitride (hereinafter simply referred to as a second layer 5); and an aluminum oxide layer 6 containing aluminum oxide ($Al_2O_3$) (hereinafter simply referred to as a third layer 6). The coating layer 3 has a configuration in which such a plurality of layers are laminated. Among the first layer 4 to the third layer 6, the first layer 4 is located closest to the substrate 2, and the third layer 6 is located farthest from the substrate 2. In addition, the second layer 5 is located between the first layer 4 and the third layer 6.

The coating layer 3 may include an additional layer besides the first layer 4, the second layer 5 and the third layer 6. The additional layer may be located closer to the substrate 2 than the first layer 4 and may be located further from the substrate 2 than the third layer 6.

The first layer 4 in this non-limiting embodiment contains MT (moderate temperature)-titanium carbonitride. The thickness of the first layer 4 can be set to 2 to 15 for example. At this time, the particle size of MT-titanium carbonitride can be set to 0.08 μm or less, for example. When the thickness of the first layer 4 is within the above range, the wear resistance and fracture resistance of the first layer 4 are enhanced.

For example, the first layer 4 can be formed by using a raw material containing titanium tetrachloride ($TiCl_4$) gas, nitrogen ($N_2$) gas and acetonitrile ($CH_3CN$) gas and forming a film at a relatively low film-forming temperature of 780° C. to 880° C.

The second layer 5 in this non-limiting embodiment contains HT (high temperature)-titanium carbonitride. The thickness of the second layer 5 can be set to 30 nm to 900 nm, for example. When the thickness of the second layer 5 is within the above range, the adhesion of the second layer 5 is high and the fracture resistance of the second layer 5 is enhanced.

For example, the second layer 5 can be formed by using a raw material containing titanium tetrachloride gas, nitrogen gas, methane ($CH_4$) gas and oxygen ($O_2$) gas and without acetonitrile gas and forming a film at a film-forming temperature higher than the temperature of the film-forming of MT-titanium carbonitride, i.e., at 900° C. to 1050° C.

Note that the configuration of the first layer 4 and the second layer 5 is merely one example, and the present invention is not limited to this structure. For example, both the first layer 4 and the second layer 5 may contain MT (moderate temperature)-titanium carbonitride, and both layers may have different compositions of additives.

The third layer 6 in this non-limiting embodiment contains aluminum oxide. The configuration of aluminum oxide in the third layer 6 is not particularly limited, but in the present non-limiting embodiment, it is an a type crystal structure. The thickness of the third layer 6 can be set to 1 to 15 μm, for example.

Figure 1:
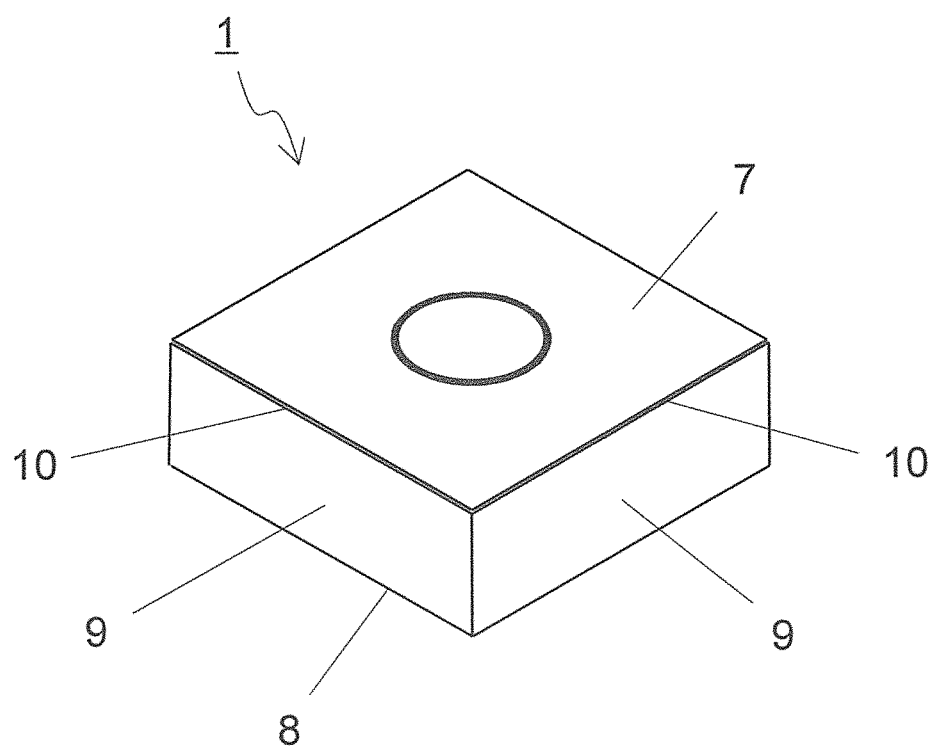
FIG. 1 is a schematic perspective view of a coated tool (cutting tool).

As shown in FIG. 1, the tool 1 includes: a first surface 7; a second surface 8 opposite to the first surface 7; and a third surface 9 located between the first surface 7 and the second surface 8. The tool 1 has a rectangular plate shape. Therefore, in this non-limiting embodiment, the first surface 7 and the third surface 9 are intersected with each other. Hereinafter, the first surface 7 may be referred to as the upper surface, the second surface 8 as the lower surface, and the third surface 9 as the side surface according to the configuration n FIG. 1.

At least a part of the third surface 9 functions as a flank surface. Further, at least a part of the first surface 7 has a function as a rake surface for scooping chips generated by cutting.

A cutting edge 10 is located at least in a part where the first surface 7 and the third surface 9 are intersected. Generally, the cutting edge 10 is located at the intersection of the rake surface and the flank surface. Cutting of the workpiece can be performed by contacting the cutting edge 10 with the workpiece. Although the coated tool of the present non-limiting embodiment is a cutting tool, it can be applied to various uses including excavation tools and cutters, in addition to cutting tools as a coated tool. In these cases, the coated tool can have excellent mechanical reliability.

Figure 3:
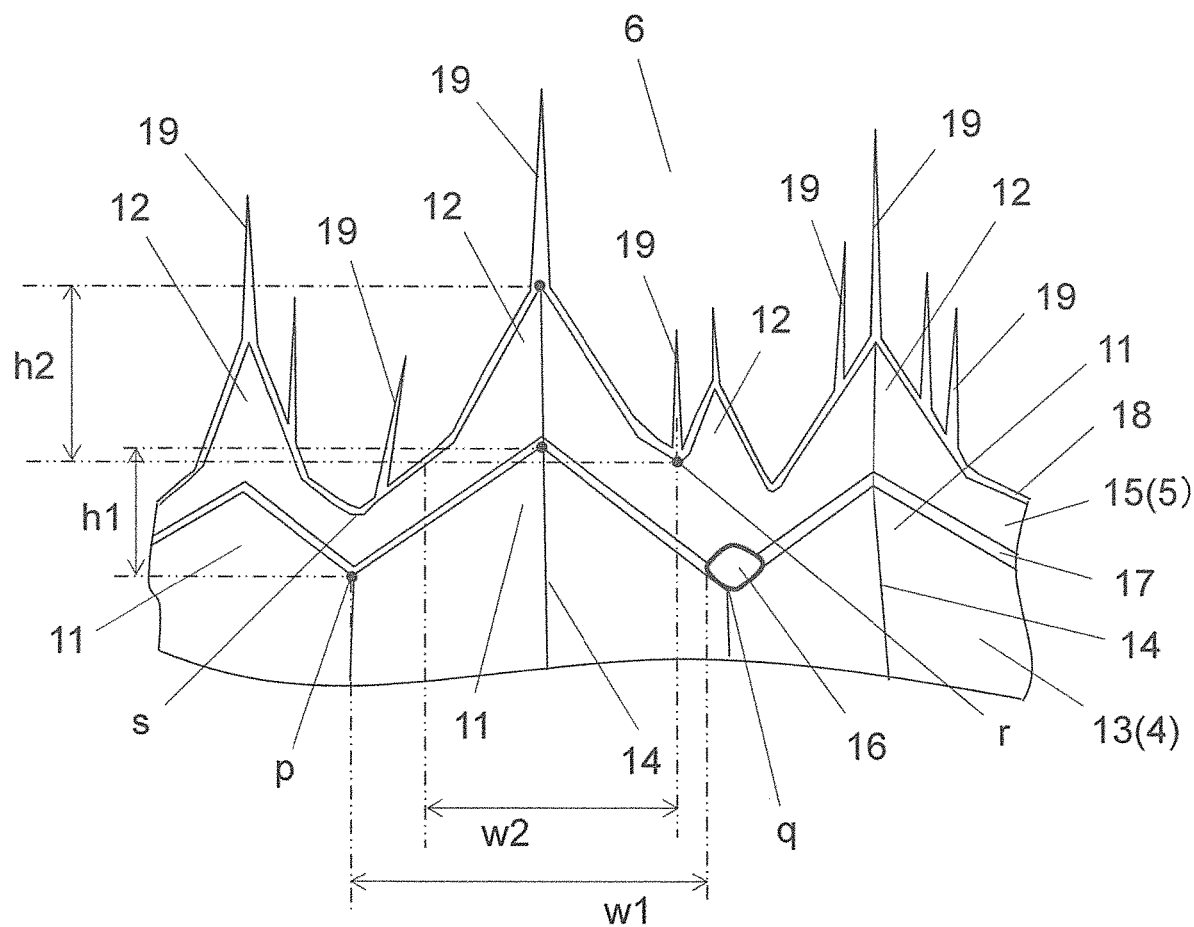
FIG. 3 is an enlarged view of the vicinity of a first layer and a second layer in the coated tool shown in FIG. 2.

As shown in FIG. 3, the first layer 4 includes a plurality of first protrusions 11 protruding toward a side of the third layer 6. Since the first layer 4 includes the plurality of first protrusions 11, the area of the interface between the first layer 4 and the second layer 5 increases. This improves the joining property between the first layer 4 and the second layer 5, so that the possibility of peeling off the second layer 5 from the first layer 4 can be reduced.

Although the size of the first protrusions 11 is not limited to a specific value, for example, a mean width of the first protrusions 11 can be set to 80 nm to 600 nm and a mean height of the first protrusions 11 can be set to 30 nm to 200 nm.

As an example shown in FIG. 3, when two valleys p and q are located respectively between the first protrusions 11 and the adjacent two first protrusions 11, the height h1 of the first protrusions 11 means a distance in the thickness direction from the valley p to the apex of the first protrusion 11, wherein valley p is further one of valleys p and q from the substrate 2 (located at higher position from the substrate 2). The mean height of the first protrusions 11 is measured by the average value of the heights h1 of the three or more adjacent first protrusions 11.

The width w1 of the first protrusion 11 means a length of the first protrusion 11 in the direction orthogonal to the thickness direction at the height position of the valley p which is located at higher position from the substrate 2 among above two valleys p and q. The mean width of the first protrusions 11 is measured by the average value of the width w1 of three or more adjacent first protrusions 11.

Further, as shown in FIG. 3, the second layer 5 includes a plurality of second protrusions 12 protruding toward a side of the third layer 6. Since the second layer 5 includes the plurality of second protrusions 12, the area of the interface between the second layer 5 and the third layer 6 increases. This improves the joining property between the second layer 5 and the third layer 6, so that the possibility of peeling off the third layer 6 from the second layer 5 can be reduced.

Although the size of the second protrusions 12 is not limited to a specific value, for example, a mean width of the second protrusions 12 can be set to 80 nm to 300 nm and a mean height of the second protrusions 12 can be set to 50 nm to 200 nm.

As an example shown in FIG. 3, when two valleys r and s are located respectively between the second protrusions 12 and the adjacent two second protrusions 12, the height h2 of the second protrusions 12 means a distance in the thickness direction from the valley r to the apex of the second protrusions 12, wherein valley r is further one of valleys r and s from the substrate 2 (located at higher position from the substrate 2). The mean height of the second protrusions 12 is measured by the average value of the heights h2 of the three or more adjacent second protrusions 12.

The width w2 of the second protrusion 12 means a length of the second protrusion 12 in the direction orthogonal to the thickness direction at the height position of the valley r which is located at higher position from the substrate 2 among above two valleys r and s. The mean width of the second protrusions 12 is measured by the average value of the width w2 of three or more adjacent second protrusions 12.

At this time, a number of second protrusions 12 is greater than that of the first protrusions 11. Both the first layer 4 and the second layer 5 contain titanium carbonitride while the third layer 6 contains aluminum oxide. Therefore, the joining property between the second layer 5 and the third layer 6 tends to be lower than the joining property between the first layer 4 and the second layer 5. However, since the number of second protrusions 12 is greater than that of the first protrusions 11, the joining property between the second layer 5 and the third layer 6 is enhanced, and the durability of the entire coating layer 3 is enhanced.

The number of first protrusions 11 and the number of second protrusions 12 do not necessarily need to be evaluated in all of the first layer 4 and the second layer 5 and may be evaluated in a cross section as shown in FIG. 2. Specifically, as shown in FIG. 2, in a cross section where ten or more of the first protrusions 11 are represented, the number of first protrusions 11 and the number of second protrusions 12 may be calculated and these two numbers may be compared.

Each of the first protrusion 11 and the second protrusion 12 has a convex shape whose width decreases with distance from the substrate 2. At this time, when a tip angle of the second protrusion 12 is smaller than a tip angle of the first protrusion 11, the durability of the entire coating layer 3 is enhanced. This is because the tip angle of the first protrusion 11 is relatively large, so that the thickness of the second layer 5 can be easily ensured stably. This is because the tip angle of the second protrusions 12 is relatively small, so that the anchor effect on the third layer 6 by the second protrusions 12 can be enhanced.

As shown in FIG. 3, the tip angles of the first protrusions 11 and the second protrusions 12 may be evaluated by evaluating the angle at the tip portions of the first protrusions 11 and the second protrusions 12, respectively in a cross section orthogonal to the surface of the substrate 2. In FIG. 3, the tip angle of the first protrusion 11 is denoted by θ1, and the tip angle of the second protrusion 12 is denoted by θ2. As shown in FIG. 3, in the present non-limiting embodiment, θ1 is an obtuse angle and θ2 is an acute angle.

A first crystal 13, which is a crystal of titanium carbonitride contained in the first layer 4, is formed of columnar crystals that are elongated in the thickness direction of the coating layer 3. In the present non-limiting embodiment, the first crystal 13 has a twin crystal structure, and a twin boundary 14 extends in the thickness direction of the coating layer 3. Also, the apex of the first protrusion 11 is located on the twin boundary 14.

In FIG. 3, the entire first crystal 13 is not shown since the figure is an enlarged view of the main part, but the first crystal 13 in the first layer 4 is elongated in the thickness direction of the coating layer 3. In the present non-limiting embodiment, the columnar crystals are simply elongated in the thickness direction of the coating layer 3, and indicate a state in which the ratio of a mean crystal width to the length in the thickness direction of the coating layer 3 is 0.3 or less on average. Therefore, even if the width of the columnar crystals in the direction orthogonal to the thickness direction is substantially constant, the width in the direction orthogonal to the thickness direction may change as the columnar crystals are away from the substrate 2.

When the first crystal 13 of the first layer 4 in this non-limiting embodiment is a columnar crystal having an average aspect ratio of 2 or more, the fracture resistance of the first layer 4 is improved. In the present non-limiting embodiment, the average aspect ratio is expressed by (mean length of crystal)/(mean crystal width). Here, the mean length is an average of dimensions corresponding to the thickness direction of the coating layer 3. The mean crystal width is an average of a dimension in a direction parallel to the substrate 2, in other words, an average of a dimension orthogonal to the thickness direction of the coating layer 3.

When the mean crystal width of the first crystal 13 is from 100 nm to 800 nm, the toughness of the first layer 4 is improved and the impact applied to the coating layer 3 can be absorbed by the first layer 4, so that the fracture resistance of the coating layer 3 is enhanced. In particular, when the mean crystal width of the first crystal 13 is from 400 nm to 600 nm, the fracture resistance of the coating layer 3 is further enhanced.

A second crystal 15, which is a crystal of titanium carbonitride contained in the second layer 5, is configured to extend in the thickness direction of the coating layer 3. Since the second layer 5 in this non-limiting embodiment is formed on the first layer 4 according to the film forming conditions already described, the plurality of second crystals 15 are arranged side by side along the shape of the upper end of the first layer 4 and extended in the thickness direction of the coating layer 3. Therefore, the second layer 5 has a wavy shape portion corresponding to the shape of the upper end of the first layer 4.

At this time, the second crystal 15 does not extend so as to strictly reflect the shape of the upper end of the first layer 4. The first layer 4 includes valleys located between the adjacent first protrusions 11 and a portion of the second crystal 15 located above the valleys of the first layer 4 extend over a large area in the thickness direction of the coating layer 3. Therefore, in the present non-limiting embodiment, a number of second protrusions 12 is greater than that of the first protrusions 11.

Furthermore, a gap 16 is present on the valley, and the second crystal 15 may be located right above this gap 16. It tends to stretch easily. Therefore, when a plurality of gaps 16 are present on at least one of a plurality of valleys, it is possible to increase the number of second protrusions 12 by extending the second crystals 15 located directly above the gaps 16 over a large area. At this time, when the gap 16 is not on the apex of the first protrusion 11 but on the valley, it can suppress the joining property between the first layer 4 and the second layer 5 from being greatly reduced.

In particular, when the second protrusions 12 are located directly above the half or more of the plurality of gaps 16, the number of second protrusions 12 can be efficiently increased, so that joining property between the second layer 5 and the third layer 6 can be further enhanced. Here, the fact that the second protrusion 12 is located right above the gap 16 means that the apex of the second protrusion 12 is located on the imaginary region where the gap 16 is stretched in the thickness direction of the coating layer 3.

The size of the gap 16 is not limited to a specific value. However, as shown in FIG. 3, when an average value of areas of the gaps 16 corresponds to an area of a circle having a diameter of 32 to 100 nm in the cross section orthogonal to the surface of the substrate 2, if the size of the gap 16 is within the range described above, the effect of increasing the number of second protrusions 12 is high, and the impact resistance of the first layer 4 and the second layer 5 can be improved.

Each of the first layer 4 and the second layer 5 contains titanium carbonitride. Here, a ratio of a content of carbon to a total content of carbon and nitrogen in the first layer 4 is defined as a first ratio, and a ratio of a content of carbon to a total content of carbon and nitrogen in the second layer 5 is defined as a second ratio. At this time, when the second ratio is smaller than the first ratio, the hardness of the first layer 4 is improved and the joining property between the second layer 5 and the third layer 6 is improved. As a result, the wear resistance and fracture resistance of the coating layer 3 are improved.

In particular, when the first ratio is from 0.3 to 0.57 and the second ratio is from 0.27 to 0.51, then the wear resistance and fracture resistance of the coating layer 3 are further improved.

When the content of carbon in the first layer 4 is 15 to 29% by atom, i.e., atomic percent, and the content of nitrogen is 22 to 35% by atom, more specifically, when the content of titanium is 45 to 60% by atom, the content of carbon is 15 to 29% by atom, and the content of nitrogen is 22 to 35% by atom, the wear resistance and fracture resistance of the coating layer 3 are further improved. The first layer 4 may contain 0.5% by atom or less of oxygen as unavoidable impurities.

When the content of carbon in the second layer 5 is 13 to 24% by atom and the content of nitrogen is 23 to 35% by atom, more specifically, the content of titanium is 48 to 60% by atom, the content of carbon is 13 to 24% by atom, and the content of nitrogen is 23 to 35% by atom, the strength of the second layer 5 is improved and the joining property between the second layer 5 and the third layer 6 are further improved. The second layer 5 may contain from 1 to 10% by atom of oxygen as unavoidable impurities.

Here, when the first layer 4 and the second layer 5 contain oxygen and the oxygen content in the second layer 5 is greater than that in the first layer 4, the gap 16 can be more readily formed.

The contents of carbon and nitrogen in the first layer 4 and the second layer 5 can be measured using an energy dispersive X-ray spectrometer (EDS) accompanying a transmission electron microscope (TEM).

Although the first layer 4 and the second layer 5 may be directly joined, in order to improve the joining property of these layers, the coating layer 3 may include a first intermediate layer located between the first layer 4 and the second layer 5, and the first intermediate layer 17 containing the components constituting the first layer 4 and the second layer 5.

The first intermediate layer 17 in this non-limiting embodiment contains 30 to 70% by atom of titanium, 24 to 30% by atom of carbon, 16 to 23% by atom of nitrogen and 2 to 5% by atom of oxygen. When the composition of the first intermediate layer 17 is as described above, the gaps 16 can be formed.

When the first crystal 13 in the first layer 4 has a twin crystal structure, if the crystal of titanium carbonitride in the first intermediate layer 17 and the second layer 5 has a twin crystal structure, and the twin boundary 14 of crystals in the first layer 4, the second layer 5 and the first intermediate layer 17 is continuous, then the binding between the first layer 4, the second layer 5 and the first intermediate layer 17 is further enhanced.

Although the second layer 5 and the third layer 6 may be directly joined, a second intermediate layer 18 containing the components constituting the second layer 5 and the third layer 6 may be provided between the second layer 5 and the third layer 6. When such a structure is satisfied, the joining property of the coating layer 3 is further improved.

When the second intermediate layer 18 contains 30 to 70% by atom of titanium, 0 to 70% by atom of carbon, 0 to 35% by atom of nitrogen and 3 to 20% by atom of oxygen, the adhesion between the second layer 5 and the third layer 6 is improved, and the crystal of aluminum oxide in the third layer 6 is easily formed into an α crystal structure.

When the second intermediate layer 18 includes a plurality of needle-like crystals 19 protruding toward the third layer 6, the adhesion between the second intermediate layer 18 and the third layer 6 is improved, so that fracture resistance of the tool 1 is improved.

In this non-limiting embodiment, the needle-like crystal 19 means that an aspect ratio is 3 or more and is tapered. Here, the aspect ratio means a number of (the length of the needle-like crystal 19)/(the width in the direction perpendicular to the extending direction of the needle-like crystal 19 in the middle of the length of the needle-like crystal 19).

The number of needle-like crystals 19 is not particularly limited, but when three or more needle-like crystals 19 are present on average per one first protrusion 11, the adhesion between the second intermediate layer 18 and the third layer 6 can be stably improved. In addition, when the length of the needle-like crystals 19 is from 20 nm to 300 nm, particularly the mean length of the needle-like crystals 19 is from 40 nm to 100 nm, it is possible to enhance the anchor effect on the third layer 6 by the needle-like crystals 19. When 80% or more of the plural needle-like crystals 19 extend in the thickness direction of the coating layer or at an inclination angle within 10° with respect to the thickness direction, the adhesion between the second intermediate layer 18 and the third layer 6 can be further enhanced.

When the thickness of the second intermediate layer 18 is 10 nm to 40 nm, it is easy to make the crystal of aluminum oxide in the third layer 6 into the α-type crystal structure while securing the strength of the second intermediate layer 18. Here, the thickness of the second intermediate layer 18 means the thickness of the portion excluding the needle-like crystal 19. Since there is a bending point between the region where the needle-like crystal 19 exists and the region where the needle-like crystal 19 does not exist, the boundary of these regions can be easily discriminated, and the thickness of the part of the second intermediate layer 18 excluding the needle-like crystal 19 can be evaluated. Further, by determining the bending point, the length of the needle-like crystal 19 can be easily evaluated.

The coating layer 3 in this non-limiting embodiment includes a base layer 20 and a surface layer 21 in addition to the above-mentioned first layer 4, the second layer 5, the third layer 6, the first intermediate layer 17 and the second intermediate layer 18.

The base layer 20 is located between the substrate 2 and the first layer 4 and is the lowermost layer in the coating layer 3. The base layer 20 contains titanium nitride (TiN) or titanium carbonitride. In the case where the coating layer 3 includes the base layer 20, it is suppressed that the components of the substrate 2 are excessively diffused into the first layer 4. Therefore, defects of the first crystal 13 in the first layer 4 are suppressed, and the strength of the first layer 4 can be increased. The thickness of the base layer 20 can be set to, for example, 0.1 μm to 1 μm.

The surface layer 21 is located on the third layer 6 and is the uppermost layer in the coating layer 3. Examples of the material of the surface layer 21 include titanium nitride, titanium carbonitride, titanium oxycarbonitride (TiCNO), and chromium nitride (CrN). When the coating layer 3 includes the surface layer 21 containing the above-mentioned material, the wear resistance of the coating layer 3 is improved. In addition, since the above-mentioned material is colored, when the coating layer 3 includes the surface layer 21, it is possible to easily distinguish whether or not the cutting edge 10 is used. The thickness of the surface layer 21 can be set to, for example, 0.1 μm to 3 μm.

It is not necessary for the coating layer 3 to include the first intermediate layer 17, the second intermediate layer 18, the base layer 20 and the surface layer 21, and part or all of these layers may be omitted.

The thickness of each layer in the coating layer 3 can be evaluated by setting ten or more measurement points at equal intervals in the field of view where three or more first protrusions 11 exist, measuring the thickness at these measurement points and calculating the average value from the measuring results.

The structure, thickness, crystal shape and the like of each layer in the coating layer 3 can be measured by observing an electron microscopic photograph (scanning electron microscope (SEM) photograph or transmission electron microscope (TEM) photograph) of the cross section of the tool 1. The mean crystal width of each crystal is a value obtained by measuring the width in the direction parallel to the surface of the substrate 2 at an intermediate length of the length in the thickness direction of each crystal and calculating the average value from the widths.

Examples of the material constituting the substrate 2 include hard alloys, ceramics and metals. The hard alloy may be, for example, a cemented carbide containing tungsten carbide (WC) and an iron group metal such as cobalt (Co) or nickel (Ni). Other hard alloy may be, for example, titanium carbonitride and Ti-based cermet containing iron group metals such as cobalt and nickel. Examples of the ceramics include silicon nitride ($Si_3N_4$), aluminum oxide, diamond and cubic boron nitride (cBN). Examples of metals include carbon steel, high speed steel and alloy steel. Among the above-mentioned materials, in the case where the substrate 2 is composed of cemented carbide or cermet, the fracture resistance and wear resistance of the substrate 2 are enhanced.

The tool 1 of the present non-limiting embodiment cuts a workpiece by contacting the workpiece with the cutting edge 10 formed on at least a part of a portion where the rake surface and the flank surface are intersected. The tool 1 can thereby perform the improved effect described above. In addition to the cutting tool of the present non-limiting embodiment, the coated tool can be applied to various uses such as wear resistant parts such as sliding parts and molds, excavation tools, tools such as edge tools, and impact resistant parts. In these cases, the coated tool can have excellent mechanical reliability.

A method of manufacturing the coated tool according to the present non-limiting embodiment will be described with reference to an example of a manufacturing method of the tool 1.

Firstly, metal powders, carbon powders and the like are appropriately added and mixed to inorganic powders selected from carbides, nitrides, carbonitrides, oxides and the like from which a hard alloy to be the substrate 2 can be formed by sintering, and a mixed powder is prepared. Next, this mixed powder is molded into a predetermined tool shape by using a molding method to produce a molded body. Examples of molding methods include press molding, cast molding, extrusion molding and cold isostatic pressing. The above-mentioned molded body is sintered under vacuum or a non-oxidizing atmosphere to prepare a substrate 2. If necessary, polishing process and honing process may be applied to the surface of the substrate 2.

Subsequently, the coating layer 3 is formed on the surface of the substrate 2 by a chemical vapor deposition (CVD) method.

Firstly, the base layer 20 is formed. Titanium tetrachloride gas of 0.5 to 10% by volume and nitrogen gas of 10 to 60% by volume are mixed with hydrogen ($H_2$) gas to prepare a first mixed gas to be used as a reaction gas. The first mixed gas is introduced into a chamber, and the base layer 20 containing titanium nitride is formed.

Subsequently, the first layer 4 is formed. A second mixed gas is prepared by mixing 0.5 to 10% by volume of titanium tetrachloride gas, 5 to 60% by volume of nitrogen gas and 0.1 to 3% by volume of acetonitrile gas with hydrogen gas. The second mixed gas is introduced into the chamber to form the first layer 4 containing MT-titanium carbonitride.

Subsequently, the first intermediate layer 17 is formed. A third mixed gas is prepared by mixing 3 to 30% by volume of titanium tetrachloride gas, 3 to 15% by volume of methane gas, 5 to 10% by volume of nitrogen gas and 0.5 to 10% by volume of carbon dioxide ($CO_2$) gas with hydrogen gas. The third mixed gas is introduced into the chamber, and the first intermediate layer 17 is formed. Since the third mixed gas contains carbon dioxide gas, gaps 16 are likely to be formed.

In the case where the first intermediate layer 17 is not formed, after the first layer 4 is formed, the film formation chamber is temporarily cooled, the sample is removed into the atmosphere, and then the sample is placed again in the film formation chamber and the film formation chamber is heated to form the second layer. As a result, the interface between the first layer 4 and the second layer 5 clearly appears.

Subsequently, the second layer 5 is formed. A fourth mixed gas is prepared by mixing 1 to 4% by volume of titanium tetrachloride gas, 5 to 20% by volume of nitrogen gas, 0.1 to 10% by volume of methane gas, and 0.5 to 10% by volume of carbon dioxide gas with hydrogen gas. The fourth mixed gas is introduced into the chamber to form the second layer 5 containing HT-titanium carbonitride.

At this time, when the content ratio of carbon dioxide gas is made higher at the initial stage of film formation than at the latter stage of film formation, the gaps 16 tend to be formed on the valleys in the first layer 4, and the defects of the second crystal 15 in the second layer 5 can be reduced.

Subsequently, the second intermediate layer 18 is formed. A fifth mixed gas is prepared by mixing 3 to 15% by volume of titanium tetrachloride gas, 3 to 10% by volume of methane gas, 3 to 25% by volume of nitrogen gas, and 0.5 to 2% by volume of carbon oxide (CO) gas with hydrogen gas. The fifth mixed gas is introduced into the chamber, and the second intermediate layer 18 is formed.

Subsequently, the third layer 6 is formed. A sixth mixed gas is prepared by setting the film forming temperature of 950° C. to 1100° C., the gas pressure of 5 kPa to 20 kPa, and mixing a reaction gas having 5% by volume to 15% by volume of aluminum trichloride ($AlCl_3$) gas, 0.5% by volume to 2.5% by volume of hydrogen chloride (HCl) gas, 0.5% by volume to 5.0% by volume of carbon dioxide gas and 0% by volume to 1% by volume of hydrogen sulfide ($H_2S$) gas with hydrogen gas. The sixth mixed gas is introduced into the chamber, and the third layer 6 is formed.

Subsequently, the surface layer 21 is formed. A seventh mixed gas is prepared by mixing 0.1 to 10% by volume of titanium tetrachloride gas and 10 to 60% by volume of nitrogen gas with hydrogen gas. The seventh mixed gas is introduced into the chamber, and the surface layer 21 is formed.

Thereafter, if necessary, the portion where the cutting edge 10 is located on the surface of the formed coating layer 3 is polished. When such polishing process is performed, since the welding of the workpiece to the cutting edge 10 is easily suppressed, the tool 1 having further excellent fracture resistance is obtained.

EXAMPLE

Firstly, a mixed powder was prepared by containing 6% by mass of metallic cobalt powder having a mean particle size of 1.2 μm, 0.5% by mass of titanium carbide (TiC) powder having a mean particle size of 2 μm, 5% by mass of niobium carbide (NbC) powder having a mean particle size of 2 μm and the residue amount of tungsten carbide powder having a mean particle size of 1.5 μm. Using the press molding, the above mixed powder was molded into a square plate shape to prepare a molded body. After removing the binder from the molded body, the molded body was sintered for 1 hour in a vacuum of 0.01 Pa at 1500° C. to prepare a substrate. Thereafter, the prepared substrate was subjected to brush processing, and R honing was applied to a part to be a cutting edge in the tool.

Subsequently, a coating layer was formed on the substrate by chemical vapor deposition under the film formation conditions in Table 1. In Tables 1 to 4, each compound is represented by a chemical symbol. The results are shown in Tables 2 to 4.

SEM observation of the cross section including the coating layer was performed on the above sample, and the thickness of each layer and the mean crystal width of the first crystal in the first layer were measured. Further, TEM observation was performed in the vicinity of the second intermediate layer in the above cross section, and the thickness of each layer, the mean width, the mean height and the number of the first protrusion and the second protrusion, the number and the size of the gaps, and the number and the mean length of the needle-like crystals in the intermediate layer were measured. In addition, the compositions of the first layer, the first intermediate layer, the second layer and the second intermediate layer were analyzed by EDS (Energy Dispersive x-ray Spectroscopy). The number of first protrusions, second protrusions and gaps is represented by a numerical value converted to the number per 1 μm of the length in the width direction perpendicular to the thickness direction of the coating layer. The size of the gap is indicated by the average value (diameter d) of diameters when the area of the gap observed by the microscope is converted into a circle.

Subsequently, a continuous cutting test and an intermittent cutting test were carried out using the obtained cutting tool, and the wear resistance and the fracture resistance were evaluated. The continuous cutting test and the intermittent cutting test were carried out by turning processing under the following conditions. The results are shown in Table 4.
(Continuous Cutting Condition)
Workpiece: ductile iron (FCD 700)
Cutting speed: 300 m/min
Feed speed: 0.3 mm/rev
Depth of cut: 1.5 mm
Cutting time: 6 minutes
Other: water-soluble cutting fluid is used.

Evaluation item: Observe the cutting edge honing portion with a scanning electron microscope and measure the flank wear width on the flank surface at the portion actually worn.
(Intermittent Cutting Condition)
Workpiece: Ductile cast iron (steel material with 8 grooves FCD 700)
Tool shape: CNMG 120408
Cutting speed: 150 m/min
Feed speed: 0.3 mm/rev
Depth of cut: 1.5 mm
Other: water-soluble cutting fluid is used.
Evaluation item: Measure the number of impacts until reaching a fracture.

TABLE 1

| Coating layer | Mixed gas compostion (% by volume) | Chamber temperature (° C.) | Pressure (kPa) |
|---|---|---|---|
| TiN-1 | $TiCl_4$: 2.5, $N_2$: 23, $H_2$: balance | 900 | 16 |
| TiCN-1 | $TiCl_4$: 1.0, $N_2$: 10, $CH_3CN$: 0.1→0.4, $H_2$: balance | 850 | 9 |
| TiCN-2 | $TiCl_4$: 1.0, $N_2$: 40, $CH_3CN$: 1.0, $H_2$: balance | 850 | 9 |
| TiCN-3 | $TiCl_4$: 1.0, $N_2$: 40, $CH_3CN$: 0.5, $H_2$: balance | 850 | 9 |
| TiCN-4 | $TiCl_4$: 3.0, $N_2$: 4, $CH_3CN$: 1.0, $H_2$: balance | 850 | 7 |
| A-1 | $CO_2$: 2.0, $H_2$: balance | 850 | 10 |
| A-2 | $CO_2$: 10.0, $H_2$: balance | 850 | 10 |
| A-3 | $TiCl_4$: 1.0, $CO_2$: 0.1, $H_2$: balance | 850 | 10 |
| TiCN-5 | $TiCl_4$: 1.0, $N_2$: 10, $CH_4$: 2.0, $H_2$: balance | 1010 | 9 |
| TiCN-6 | $TiCl_4$: 1.0, $N_2$: 5, $CH_4$: 1.5, $H_2$: balance | 1010 | 9 |
| TiCN-7 | $TiCl_4$: 1.0, $N_2$: 3, $CH_4$: 6, $H_2$: balance | 1010 | 9 |
| TiCN-8 | $TiCl4$: 3.0, $N2$: 4, $CH3CN$: 1.0, $H2$: balance | 850 | 40 |
| B-1 | $TiCl_4$: 7.0, $CH_4$: 3.5, $N_2$: 5.0, CO: 1.0, $H_2$: balance | 1000 | 15 |
| B-2 | $TiCl_4$: 7.0, $CH_4$: 3.5, CO: 1.0, $H_2$: balance | 1000 | 15 |
| B-3 | $TiCl_4$: 3.0, $CH_4$: 4.0, $N_2$: 4.0, $CO_2$: 1.5, $H_2$: balance | 1000 | 15 |
| $Al_2O_3$ | $AlCl_3$: 7.0, HCl: 1.0, $CO_2$: 1.0, $H_2S$: 0.5, $H_2$: balance | 1000 | 10 |
| TiN-2 | $TiCl_4$: 2.0, $N_2$: 40, $H_2$: balance | 1010 | 80 |

TABLE 2

| | | | Coating layer | | | | | | | | | |
|---|---|---|---|---|---|---|---|---|---|---|---|---|
| | | | First layer (Composition (% by atom), Width · Height (nm)) | | | | | | | | | |
| | Lower layer | | | | | | | Mean | First protrusion | | | Gap | |
| Sample No. | Species (Thickness(μm)) | Condition | Ti | C | N | O | C/(C + N) | crystal width (nm) | Width | Height | Number of pieces | Thickness (μm) | Number of pieces | d (nm) |
| 1 | TiN-1 (0.5) | TiCN-1 | 48 | 27 | 25 | <0.05 | 0.52 | 300 | 250 | 100 | 3.3 | 9 | 2.2 | 45 |
| 2 | TiN-1 (0.5) | TiCN-1 | 48 | 28 | 24 | <0.05 | 0.54 | 300 | 250 | 100 | 3.3 | 9 | 3 | 70 |
| 3 | TiN-1 (0.5) | TiCN-1 | 48 | 27 | 25 | <0.05 | 0.52 | 300 | 250 | 100 | 3.3 | 9 | 2.2 | 45 |
| 4 | TiN-1 (1.0) | TiCN-1 | 49 | 29 | 22 | <0.05 | 0.57 | 250 | 270 | 100 | 4 | 9 | 3.1 | 32 |
| 5 | — | TiCN-2 | 50 | 15 | 35 | <0.05 | 0.3 | 550 | 800 | 50 | 1.8 | 9 | 1 | 100 |
| 6 | TiN-1 (1.0) | TiCN-1 | 48 | 30 | 22 | <0.05 | 0.58 | 250 | 250 | 100 | 4 | 9 | 2.1 | 48 |
| 7 | TiN-1 (0.5) | TiCN-3 | 49 | 7 | 43 | <0.05 | 0.14 | 500 | 450 | 80 | 2.5 | 9 | — | |
| 8 | TiN-1 (0.5) | TiCN-1 | 48 | 27 | 25 | <0.05 | 0.52 | 300 | 250 | 100 | 3.3 | 9 | — | |
| 9 | TiN-1 (0.5) | TiCN-1 | 48 | 27 | 25 | <0.05 | 0.52 | 300 | 250 | 100 | 3.3 | 9 | — | |
| 10 | TiN-1 (0.5) | TiCN-4 | 50 | 25 | 25 | <0.05 | 0.5 | 500 | | — | | 7.8 | 2* | 9 |

*In the first layer, a band having gathered gaps is present at a position having a depth of 2 μm from the interface of a side of the second layer.

TABLE 3

| | | First intermediate layer (Composition (% by atom)) | | | | | Second layer (Composition (% by atom), Width · Height (nm)) | | | | | | | | |
|---|---|---|---|---|---|---|---|---|---|---|---|---|---|---|---|
| | | | | | | | | | | | | | Second protrusion | | |
| Sample No. | Condition | Ti | C | N | O | Thickness (nm) | Condition | Ti | C | N | O | C/(C + N) | Width | Height | Number of pieces | Thickness (nm) |
| 1 | A-1 | 50 | 24 | 22 | 4 | 10 | TiCN-5 | 50 | 20 | 29 | 1 | 0.41 | 150 | 110 | 4.8 | 700 |
| 2 | A-2 | 48 | 32 | 18 | 2 | 15 | TiCN-5 | 50 | 22 | 26 | 2 | 0.46 | 100 | 150 | 5.5 | 900 |
| 3 | A-1 | 50 | 24 | 22 | 4 | 8 | TiCN-6 | 52 | 24 | 23 | 1 | 0.51 | 130 | 110 | 4 | 300 |
| 4 | A-1 | 51 | 26 | 20 | 3 | 10 | TiCN-5 | 50 | 20 | 28 | 2 | 0.42 | 200 | 100 | 4.8 | 100 |
| 5 | A-1 | 48 | 24 | 23 | 5 | 20 | TiCN-5 | 50 | 13 | 35 | 2 | 0.27 | 250 | 60 | 2.5 | 30 |
| 6 | | — | | | | | TiCN-5 | 50 | 27 | 23 | <0.05 | 0.54 | 200 | 80 | 4.5 | 85 |
| 7 | A-1 | 51 | 30 | 16 | 3 | 10 | TiCN-5 | 50 | 27 | 20 | 3 | 0.57 | 250 | 100 | 2 | 600 |
| 8 | A-1 | 51 | 42 | 4 | 3 | 10 | TiCN-1 | 50 | 35 | 14 | 1 | 0.71 | 200 | 110 | 3.3 | 600 |
| 9 | A-1 | 51 | 40 | 6 | 3 | 10 | TiCN-7 | 53 | 40 | 4 | 3 | 0.91 | 200 | 100 | 3 | 600 |
| 10 | | — | | | | | TiCN-8 | 50 | 25 | 25 | <0.05 | 0.5 | | — | | 1000 |

TABLE 4

| | | Coating layer | | | | | | | | | | |
|---|---|---|---|---|---|---|---|---|---|---|---|---|
| | | Second intermediate layer (Composition (% by atom), Thickness · Length (nm), Number of pieces) | | | | | | | Third layer | Surface layer Species (Thickness (μm)) | Cutting performance | |
| | | | | | | | Needle-like protrusion | | | | Flank wear width (mm) | Number of impacts (Times) |
| Sample No. | Condition | Ti | C | N | O | Thickness | Length | Number of pieces | Thickness (μm) | | | |
| 1 | B-1 | 50 | 15 | 23 | 12 | 20 | 80 | 8.3 | 6 | TiN-2 (1.5) | 0.09 | 9200 |
| 2 | B-1 | 50 | 15 | 23 | 12 | 10 | 100 | 9 | 7 | — | 0.14 | 8500 |
| 3 | B-1 | 50 | 15 | 23 | 12 | 35 | 40 | 8.3 | 3 | TiN-2 (1.5) | 0.15 | 8000 |
| 4 | B-2 | 50 | 38 | 0 | 12 | 20 | — | | 6 | TiN-2 (3) | 0.19 | 8200 |
| 5 | B-1 | 50 | 15 | 23 | 12 | 40 | — | | 6 | TiN-2 (1) | 0.21 | 8100 |
| 6 | B-2 | 50 | 38 | 0 | 12 | 30 | — | | 8 | TiN-2 (1) | 0.37 | 7500 |
| 7 | B-1 | 50 | 15 | 23 | 12 | 20 | — | | 7 | TiN-2 (0.5) | 0.48 | 6000 |
| 8 | B-1 | 50 | 15 | 23 | 12 | 20 | — | | 7 | TiN-2 (2) | 0.49 | 5300 |
| 9 | B-1 | 50 | 15 | 23 | 12 | 20 | — | | 7 | TiN-2 (2) | 0.31 | 5500 |
| 10 | B-3 | 50 | 0 | 25 | 25 | 20 | — | | 7 | TiN-2 (2) | 0.39 | 4000 |

According to the results of Tables 1 to 4, in sample Nos. 1 to 6 in which the first layer includes the first protrusion, the gap is present on the valley of the first layer, the second layer includes the second protrusion, and the number of second protrusions is greater than that of the first protrusions, the flank wear width was small and the number of impacts exceeded 6000 times. In each of the samples, the second protrusions were formed just above 50% or more of the gaps.

Additional advantages and modifications will readily occur to those skilled in the art. Therefore, the invention in its broader aspects is not limited to the specific details and representative embodiments shown and described herein. One skilled in the art would recognize that various features in the disclosure are not necessarily mutually exclusive, as some aspects of the disclosure may be combined with one or more other embodiments and aspects of the disclosure. Accordingly, various modifications may be made without departing from the spirit or scope of the general inventive concept as defined by the appended claims and their equivalents.

DESCRIPTION OF THE REFERENCE NUMERALS

1: Cutting tool (tool)
2: Substrate
3: Coating layer
4: First layer
5: Second layer
6: Third layer
7: First surface
8: Second surface
9: Third surface
10: Cutting edge
11: First protrusion 12: Second protrusion
13: First crystal
14: Twin boundary
15: Second crystal
16: Gap
17: First intermediate layer
18: Second intermediate layer
19: Needle-like protrusion
20: Base layer
21: Surface layer

The invention claimed is:

1. A coated tool, comprising:
a substrate; and
a coating layer located on a surface of the substrate,
wherein the coating layer comprises:
  a first titanium carbonitride layer located on the substrate;
  a second titanium carbonitride layer located on the first titanium carbonitride layer; and
  an aluminum oxide layer located on the second titanium carbonitride layer,
wherein the first titanium carbonitride layer comprises a plurality of first protrusions protruding toward a side of the aluminum oxide layer,
wherein the second titanium carbonitride layer comprises a plurality of second protrusions protruding toward a side of the aluminum oxide layer, and
wherein a number of the second protrusions is greater than a number of the first protrusions.

2. The coated tool according to claim 1,
wherein a tip angle of the second protrusion is smaller than a tip angle of the first protrusion in a cross section orthogonal to the surface of the substrate.

3. The coated tool according to claim 1,
wherein the first titanium carbonitride layer comprises a gap in valleys located between adjacent first protrusions, and
wherein the second protrusion is located right above the gap.

4. The coated tool according to claim 3,
wherein the first titanium carbonitride layer comprises a plurality of the gaps, and an average area of the gaps corresponds to an area of a circle having a diameter of 32 to 100 nm in a cross section orthogonal to the surface of the substrate.

5. The coated tool according to claim 1, to
wherein when a ratio of a content of carbon to a total content of carbon and nitrogen in the first titanium carbonitride layer is defined as a first ratio, and a ratio of a content of carbon to a total content of carbon and nitrogen in the second titanium carbonitride layer is defined as a second ratio, the second ratio is smaller than the first ratio.

6. The coated tool according to claim 5,
wherein the first ratio is from 0.3 to 0.57 and the second ratio is from 0.27 to 0.51.

7. The coated tool according to claim 5,
wherein the content of carbon in the first titanium carbonitride layer is from 15 to 29 atomic percent, and the content of nitrogen in the first titanium carbonitride layer is from 22 to 35 atomic percent, and
wherein the content of carbon in the second titanium carbonitride layer is from 13 to 24 atomic percent, and the content of nitrogen in the second titanium carbonitride layer is from 23 to 35 atomic percent.

8. The coated tool according to claim 1,
wherein the first titanium carbonitride layer comprises columnar crystals of carbonitride titanium nitride comprising an average aspect ratio of 2 or more.

9. The coated tool according to claim 1,
wherein the first titanium carbonitride layer comprises a thickness of 2 to 15 μm.

10. The coated tool according to claim 1,
wherein the second titanium carbonitride layer comprises a thickness of 30 to 900 nm.

11. The coated tool according to claim 1,
wherein the coating layer further comprises an intermediate layer located between the first titanium carbonitride layer and the second titanium carbonitride layer, and
wherein the intermediate layer comprises 30 to 70 atomic percent of titanium, 24 to 30 atomic percent of carbon, 16 to 23 atomic percent of nitrogen and 2 to 5 atomic percent of oxygen.

12. The coated tool according to claim 1,
wherein the coating layer further comprises an intermediate layer located between the second titanium carbonitride layer and the aluminum oxide layer, and
wherein the intermediate layer comprises 30 to 70 atomic percent of titanium, 0 to 70 atomic percent of carbon, 0 to 35 atomic percent of nitrogen and 3 to 20 atomic percent of oxygen.

13. The coated tool according to claim 12,
wherein the intermediate layer comprises a needle-like crystal projecting toward the aluminum oxide layer.

14. The coated tool according to claim 13,
wherein a thickness of a part of the intermediate layer excluding the needle-like crystal is 10 to 40 nm.

15. The coated tool according to claim 1,
wherein in the first titanium carbonitride layer comprises oxygen.

16. The coated tool according to claim 15,
wherein in the second titanium carbonitride layer further comprises oxygen, and
wherein an oxygen content present in the second titanium carbonitride layer is greater than an oxygen content present in the first titanium carbonitride layer.

* * * * *